United States Patent [19]

Plaisted et al.

[11] Patent Number: 4,909,427
[45] Date of Patent: Mar. 20, 1990

[54] BONDING WIRE BALL FORMATION

[76] Inventors: Alan H. Plaisted, R.D. 1, P.O. Box 4860, Swanton, Vt. 05488; John A. Kurtz, 2 Birchcroft La., Saco, Me. 04072-2205

[21] Appl. No.: 353,012

[22] Filed: May 17, 1989

[51] Int. Cl.⁴ ........................ B23K 20/24; B23K 37/00
[52] U.S. Cl. ........................................ 228/4.5; 228/42; 219/56.21
[58] Field of Search ............... 228/1.1, 4.5, 42, 179, 228/904; 219/56.21, 56.22

[56] References Cited

U.S. PATENT DOCUMENTS

| | | | |
|---|---|---|---|
| 4,390,771 | 6/1983 | Kurtz et al. | 219/56.22 |
| 4,476,366 | 10/1984 | Kurtz et al. | 219/56.22 |
| 4,513,190 | 4/1985 | Ellett et al. | 219/56.21 |
| 4,594,493 | 6/1986 | Harrah et al. | 219/56.21 |

FOREIGN PATENT DOCUMENTS

| | | | |
|---|---|---|---|
| 152962 | 1/1979 | Japan | 228/4.5 |
| 244033 | 12/1985 | Japan | 228/4.5 |

*Primary Examiner*—Nicholas P. Godici
*Assistant Examiner*—Samuel M. Heinrich
*Attorney, Agent, or Firm*—Hayes, Soloway, Hennessey & Hage

[57] ABSTRACT

A ball bonding apparatus is provided with a "flame off" electrode which is positioned, during flame off, around and above the capillary tool so that the spark for melting the wire passes in close proximity to the end of the capillary tool. The flame off electrode is preferably mounted on the capillary tip.

6 Claims, 2 Drawing Sheets

BONDING WIRE BALL FORMATION

TECHNICAL FIELD

The invention relates to a new method and apparatus for forming a ball at the end of bonding wire or lead wire extending from a capillary bonding tube. Such ball formation has particular application for ball bonding of a fine lead wire to the die pad of an integrated circuit chip The present invention provides rapid and controlled delivery of energy for forming balls of uniform quality while providing for controlled arc formation which maintains the capillary tip free of deposited metal.

BACKGROUND ART

Bonding of lead wires to a a microcircuit chip or die mounted on a lead frame for coupling to external circuitry is generally accomplished by ball bonding. According to this technique, a fine lead wire or bonding wire is held in a capillary tool so that the lead wire projects beyond the end of the tool. The capillary tool forms part of a ball bonding machine in which the tool is appropriately mounted and positioned over the metalized die pad of an integrated circuit chip. Examples of such ball bonding machines include the Model 478 High Speed Tailless Thermocompression Ball Bonder, manufactured by Kulicke & Soffa Industries, Inc. (K&S), Horsham, Pa. 19044, described in U.S. Pat. No. 3,643,321; the K&S Model 1418/1419, Automatic Highspeed Wire Bonder with Digital Bonding Head; K&S Model 1482, Automatic Wire Bonder; and the ball bonding machines of The Welding Institute, Abington, England, described in U.S. Pat. Nos. 4,323,759 and 4,098,447.

A ball is formed at the end of the lead wire or bonding wire by, for example, arc discharge between the bonding wire and another electrode. A melted portion of the metal at the end of the lead wire forms a spherical ball under surface tension. After solidification, the metal ball at the end of the lead wire is brought into intimate contact with the metalized die pad and a bond is formed typically by thermocompression and/or ultrasonic bonding. Various disadvantages of prior art ball bonding machines and methods are discussed in the "Background Art" section of U.S. Pat. No. 4,390,770 entitled "Bonding Wire Ball Forming Method and Apparatus", assigned to Fairchild.

According to the improved apparatus and method for bonding wire ball formation described in U.S. Pat. Nos 4,390,771 and 4,476,366 a ball is formed at the end of bonding wire extending from a capillary tool by substantially enclosing the end of the bonding wire in a shroud or shield, flooding the shroud or shield and the end of the bonding wire with an inert gas, and generating a controlled electric arc discharge between the lead wire and the shroud or shield which function as the complementary electrode. According to the method disclosed, a controlled pulse train of electrical pulses is generated and delivered for arc discharge between the wire and shroud so that the quantity of energy delivered by the pulse train may precisely match the energy requirements for melting a ball of desired dimensions.

In U.S. Pat. No. 4,476,366 the circuit is coupled between the gas shroud and the lead wire for establishing controlled electrical discharge between the end of the bonding wire and the shroud for melting and forming a ball of solder.

U.S. Pat. No. 4,594,493 (Harrah) describes a wire bonding system wherein a plurality of electrodes are mounted on a ring positionable below the capillary tip surrounding the wire extending from the tip. U.S. Pat. No. 4,691,854 (Haefling) describes a capillary with a nonconductive end for allegedly preventing deposition of metal thereon.

U.S. Pat. Nos. 4,482,794 and 4,476,365 are also of general interest in this field.

SUMMARY OF THE INVENTION

In the present invention the end of the bonding wire is retained in a capillary tool for ball bonding and means are provided for supporting the capillary tool and a spark discharge electrode adjacent to and above the tip of the capillary bonding tube. A particular feature of the present invention involves the arrangement whereby the spark sustaining area of the electrode is above the tip of the capillary bonding tube so that the ball forming discharge between the wire end and the electrode passes in sufficiently close proximity to the capillary tip so that it will remove any metal adhering to the tip. In ball formation with gold it does not usually accumulate on the tip because of its inertness. But other metals accumulate on the tip, particularly more active metal like aluminum and copper. In one preferred form of the invention the spark electrode is supported by the capillary. In another embodiment the electrode is independently mounted on a means permitting movement of the electrode to its spark generating position adjacent to and above the capillary tip.

DESCRIPTION OF THE INVENTION

As mentioned briefly above the principle feature of the present invention involves the use of the spark generating electrode (often referred to as a flame off electrode) which is positioned, during the spark discharge in close proximity to the capillary tip and above the capillary tip so that the spark passes in close proximity to the tip.

In a preferred form of the invention the capillary tip is preferably formed at the center of a ceramic tube. Closely surrounding this tip, and extending almost to the capillary opening, is an electrode surface. In one preferred form of the invention, this electrode's surface is permanently attached to the capillary tip and is energized by either a conductive lead carried by the capillary tube or by contact with a lead such as a portion of the shroud normally surrounding the capillary tip for flooding the volume surrounding the ball with an inert gas during ball formation.

In another embodiment of the invention the electrode is supported on a separate means which provides relative movement between the capillary tip and the electrode to position the electrode adjacent to and above the capillary tip when the discharge is to be created for the ball forming operation.

For further understanding of the invention reference should be had to the following detailed description considered in connection with the following drawings wherein.

Figure 1:
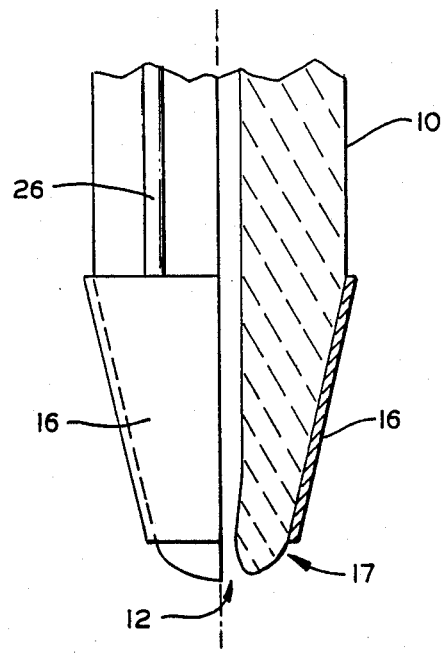
FIG. 1 is a partially sectional schematic representation of one preferred form of the invention.

Referring now to FIG. 1, the ceramic capillary tip is shown in a partially cross section schematic representation wherein the ceramic body 10 has a small capillary opening 12 through which a metal wire 14 (e.g. aluminum, copper, gold or other suitable material) is passed. The hole diameter at its narrowest point is on the order of 0.001" to 0.006" and can be formed of any of the normal ceramic materials such as alumina, sapphire, ruby, titanium carbide, etc. used for such tips. Such tips are available commercially from numerous manufacturers and are sized and shaped for a particular wire diameter and/or ball bonding alloy and operation. The precise shape and construction of the capillary tip is not part of this invention. The modification and positioning of the spark generating electrode is the important feature of the present invention.

The spark generating electrode, shown schematically at 16 in one preferred embodiment of the invention is a layer of metal, which may be a solid metal sheet, or a thick coating applied by one of the many available thick film techniques. In one preferred form of the invention the electrode is formed of a sheet of metal. The electrode 16 can be formed of a sheet by a cupping operation so as to have an internal shape matching the exterior shape of the ceramic capillary tip. The hole adjacent the capillary tip can be formed by suitable drilling or filing operations or even by spark discharge machining to provide a hole at the bottom of the electrode which is indicated at 17 and which is substantially larger than the capillary hole 12 through which the wire 14 passes. The electrode is preferably secured to the capillary tube by use of an epoxy cement.

Figure 3:
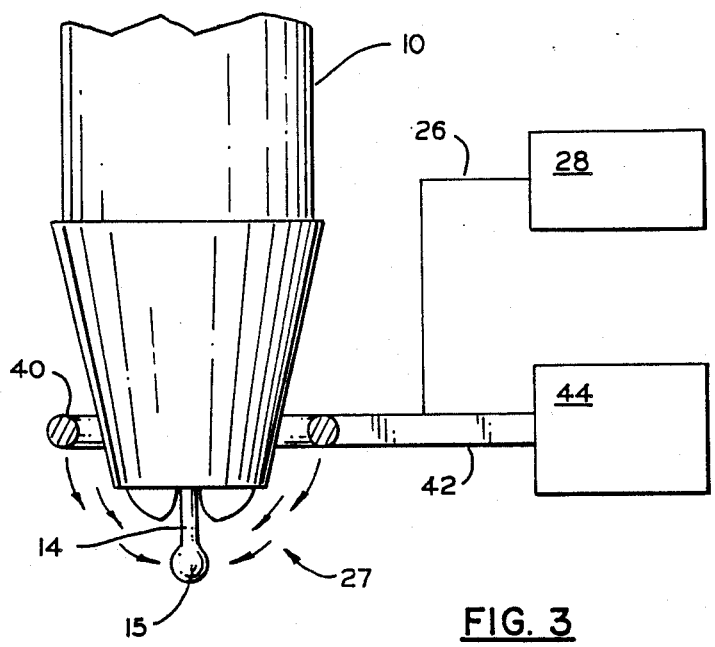
FIG. 3 is a partially sectional view of another embodiment of the invention showing a moveable sparking electrode.
Figure 3A:
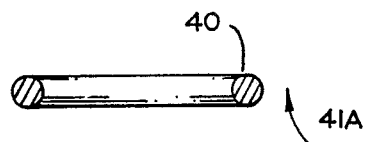
FIGS. 3A and 3B are schematic representations of several paths of frame 1 of the moveable electrode.
Figure 3B:
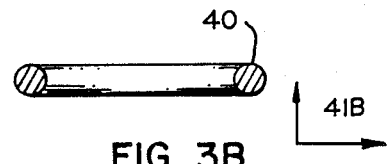

The electrode is preferably formed of a metal such as nickel or tungsten and the like and is connected by a suitable lead wire such as 26 from which voltage is provided to the sparking electrode by means of a power source 28 of normal construction (see FIG. 3). In general this comprises a suitable source for providing a high voltage short pulse of electricity.

Figure 1A:
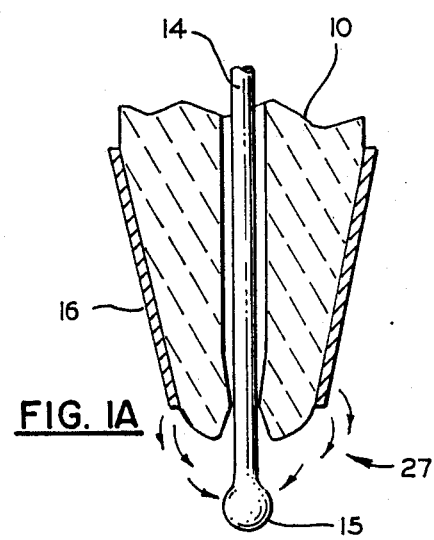
FIG. 1A is a portion of FIG. 1 (fully sectional) showing the operation of the spark discharge.

During the ball forming discharge 27 (as seen in FIG. 1A) the end of the wire 14 extending from the capillary opening 12 usually has a number of very sharp points. Generally this results from the wire being pulled from the previous bond or from initial shearing when the wire is first inserted in the tool when the spark discharge 27 is created it passes from the electrode 16 to the end of the wire passes in very close proximity to the tip. The spark discharge is shown schematically as small arrows 27 passing from the spark generating (flame off) electrode to the forming ball 15 on the end of the wire extending through the capillary. As the ball 15 increases in diameter the discharge 27 continues to pass immediately adjacent to the tip and will melt any metal which has been deposited inadvertently on the tip during preceding ball bonding operation.

Figure 2:
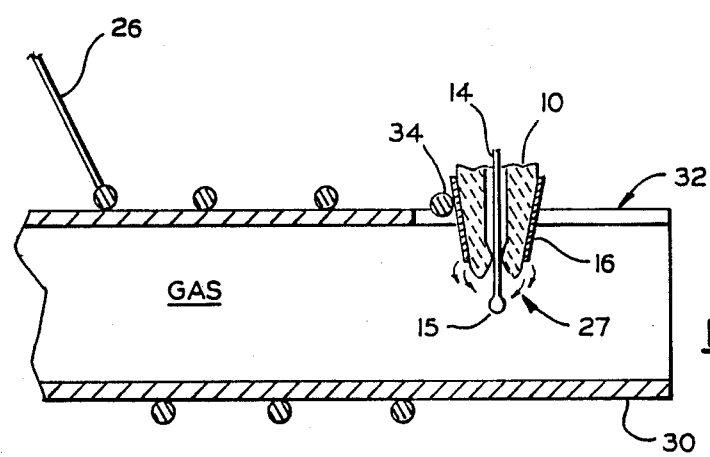
FIG. 2 is a modification of the invention employing a gas shield.

When the wire is copper, for example, it must be shielded by an inert gas as described in U.S. Pat. No. 4,476,366. The contact to the sparking electrode 16 for providing the necessary high voltage maybe provided by a portion of the shield. Thus, as see in FIG. 2, there is provided a spring contact 34 in the top part of a notch 32 in tube 30 through which the inert gas is passed as in Kurtz U.S. Pat. No. 4,476,366 discussed above. In this case after contact is made between the spring 34 carried by the tube 30 the spring is energized (through lead 26) by the high voltage which then energizes the sparking electrode 16 carried by the capillary ti and the discharge 27 to the wire is created. In other respects the operation of the discharge for melting the wire, forming the ball and cleaning the tip is the same as discussed in connection with the operation in FIG. 1.

In still another method of providing the electrode immediately adjacent the capillary tip, the electrode can be provided as a separate element (although this is less preferred) that can be moved into a position adjacent the tip but above the plane of the capillary tip. In this case, shown in FIG. 3, there is a schematic diagramatic representation of an electrode 40 in the shape of a small ring (which can be split) carried by support 42 which can be moved into position immediately surrounding the capillary tip by moving mechanism 44 and then when the discharge voltage is applied to this cylindrical electrode it creates the ball forming spark discharge 27, this discharge passing immediately adjacent the capillary tip. In FIG. 4A the separate electrode is moved as shown by arrow 41A around a pivot to its sparking position while in FIG. 4B the separate electrode is carried by the support in the direction shown by arrows 41B laterally and upwardly to the sparking position. As can well be appreciated, in this form of the invention, the tip can equally be moved, thus the electrode ca be moved to the tip or the tip can be moved to the electrode. The important feature is that during the spark formation the electrode immediately surrounds the capillary tip and is above the tip of the capillary which carries the wire.

While it is preferred that the electrode completely surround the capillary tip it can be interrupted or only partially surround this tip.

Similarly while one method of attaching the electrode to the tip has been described above numerous other mechanical and chemical means such as adhesive, screw connections, etc. may be employed.

A valuable feature of this lateral electrode carried by the capillary is that a fully automatic wire bonder need not wait for the flame off electrode to swing under the capillary. This will increase the throughput of such a wire bonder.

We claim:

1. In a ball bonding apparatus for ball formation by melting the end of bonding wire retained in a capillary tool for ball bonding to a microelectronic substrate, said apparatus comprising means for supporting adjacent the tip of said capillary wire holding and bonding tool; the improvement wherein the spark sustaining area of said electrode is above the tip so that the ball forming discharge between the wire end and electrode passes in sufficiently close proximity to said tip to remove any metal adhering to said tip.

2. The apparatus of claim 1 wherein said electrode is supported on said tip.

3. The apparatus of claim 1 wherein said electrode is independently mounted on a means permitting movement of said electrode to its spark generating position.

4. The apparatus of claim 1 wherein said electrode and bonding tool are separately mounted for relative movement to the spark generating position.

5. The apparatus of claim 1 wherein an inert gas shield means is provided for shielding said tool during ball formation and an electrical contact is supported in position to energize said electrode when the shield is in position adjacent the tool.

6. The apparatus of claim 5 wherein the electrical contact is supported on the shield.

* * * * *

UNITED STATES PATENT AND TRADEMARK OFFICE
CERTIFICATE OF CORRECTION

PATENT NO. : 4,909,427

DATED : March 20, 1990

INVENTOR(S) : ALAN H. PLAISTED AND JOHN A. KURTZ

It is certified that error appears in the above-identified patent and that said Letters Patent is hereby corrected as shown below:

Claim 1, column 4, line 47, insert --said capillary tool and a spark discharge electrode-- after "supporting".

Signed and Sealed this

Thirteenth Day of August, 1991

Attest:

HARRY F. MANBECK, JR.

Attesting Officer

Commissioner of Patents and Trademarks